United States Patent [19]
Tachikawa et al.

[11] Patent Number: 4,664,933
[45] Date of Patent: May 12, 1987

[54] PROCESS FOR PRODUCTION OF A-15 TYPE SUPERCONDUCTOR COMPOUND

[75] Inventors: Kyoji Tachikawa, Tokyo; Kazumasa Togano; Hiroaki Kumakura, both of Ibaraki, all of Japan

[73] Assignee: National Research Institute for Metals, Tokyo, Japan

[21] Appl. No.: 807,876

[22] Filed: Dec. 11, 1985

[30] Foreign Application Priority Data

Dec. 11, 1984 [JP] Japan .................... 59-260032

[51] Int. Cl.$^4$ .............................................. B05D 5/12
[52] U.S. Cl. ........................................ 427/12; 427/35; 427/53.1; 427/62
[58] Field of Search ............... 427/62, 35, 53.1, 12

[56] References Cited

U.S. PATENT DOCUMENTS 3,392,055  7/1968  Martin ................................... 427/62
3,661,639  5/1972  Caslaw ................................... 427/62
4,009,364  2/1977  Ladstadter ........................... 427/53.1
4,271,347  6/1981  Svenson ............................... 427/53.1

Primary Examiner—Richard Bueker
Attorney, Agent, or Firm—Wenderoth, Lind & Ponack

[57] ABSTRACT

An A-15 type superconductor compound having the composition $A_3B$ composed of niobium (element A) and at least one element (B) selected from gallium, aluminum and germanium is produced by coating at least one element B on a substrate of niobium, heat-treating the coated niobium substrate at a temperature of 500° to 2,000° C. for 1 second to 300 hours to form intermetallic compounds of niobium and the coated element which are richer in element B than A-15 $A_3B$ compound, and thereafter subjecting the substrate to the irradiation of high density energy beams such as electron beams or laser beams to form the A-15 type superconductor compound having the composition $A_3B$.

5 Claims, No Drawings

PROCESS FOR PRODUCTION OF A-15 TYPE SUPERCONDUCTOR COMPOUND

BACKGROUND OF THE INVENTION

1. Field of the Invention

This invention relates to a process for producing an A-15 type superconductor compound, and more specifically to a process for producing an A-15 type superconductor compound having the composition $A_3B$ composed of niobium (element A) and at least one element (B) selected from the group consisting of gallium, aluminum and germanium.

2. Description of the Prior Art

A superconductor material having an electric resistance of zero can permit flowing of a large current without power consumption, and the superconducting state is maintained even in a high magnetic field. Because of this characteristic, superconductor materials have increasingly come into use as coil materials for electromagnets generating a high magnetic field which are used, for example, in an NMR analysis device, an energy storage device, a nuclear reactor, and a particle accelerator for high-energy physics.

An Nb-Ti alloy and $Nb_3Sn$ and $V_3Ga$ compounds called A-15 type compounds are now used as a superconductor material for coil materials used in electromagnets capable of generating a high magnetic field. The Nb-Ti alloy has high plasticity and can be directly worked into a wire or tape. $Nb_3Sn$ and $V_3Ga$, the A-15 type compounds, are hard and brittle and cannot be directly worked. Hence, working of these A-15 type compounds into a wire or tape relies on a diffusion reaction by a surface diffusion method or a so-called bronze method. For example, Japanese Patent Publications Nos. 21356/1972 and 3038/1974 disclose the production of a superconductor by the surface diffusion method.

The upper critical magnetic fields $H_{c2}$ of Nb-Ti, $Nb_3Sn$ and $V_3Ga$ at 4.2 K. are 12 T, 21 T and 22 T (tesla), respectively. As the applied magnetic field approaches the upper critical magnetic field, the critical current density rapidly decreases. Accordingly, even when a $V_3Ga$ wire is used, the magnetic field generated by a superconducting magnet is 17.5 T at the highest. On the other hand, as the utility of superconductors has been developed, the superconducting magnets have been required to generate a stronger magnetic field, and it has been desired to develop superdonducting wires or tapes having higher performance. For example, it it said that a superconducting magnet for Mirrer-type fusion reactors is required to generate a magnetic field of 20 to 24 T. Such a high magnetic field is difficult to obtain by existing $Nb_3Sn$ and $V_3Ga$. $Nb_3Ga$ ($H_{c2}=34T$), $Nb_3Al$ ($H_{c2}=30T$) and $Nb_3(Al, Ge)$ ($H_{c2}=41T$), which all fall into the category of A-15 type compounds, are possible candidates for a material capable of generating such a high magnetic field. If, however, such materials are to be produced by the conventional surface diffusion method, the heat-treating temperature must be very high. Consequently, the crystal grains become large, and the critical current density Jc of the resulting materials, which is of importance in practical applications, is markedly reduced. When the bronze method using a copper-base alloy is applied to these materials, the high heat-treatment temperatures used result in dissolving of copper in the superconductor phase. As a result, the resulting conductors have deteriorated superconducting properties, and become unsuitable for practical applications.

SUMMARY OF THE INVENTION

It is an object of this invention to provide a process for easily producing an A-15 type superconductor compound capable of having a sufficiently high critical current density in a high magnetic field region.

Another object of this invention is to provide a process for easily producing a long strip of a superconductor compound having a high performance.

According to this invention, there is provided a process for producing an A-15 type superconductor compound having the composition $A_3B$ composed of niobium (element A) and at least one element (B) selected from the group consisting of gallium, aluminum and germanium, which comprises a step of coating at least one element B on a substrate of niobium, a step of heat-treating the coated substrate at a temperature of 500° to 2,000° C. for 1 second to 300 hours to form intermediate intermetallic compounds of niobium and the element B on the substrate, and a step of subjecting the substrate having the intermetallic compounds formed thereon to irradiation of high-energy density beams to form the A-15 type superconductor compound having the composition $A_3B$.

DETAILED DESCRIPTION OF THE INVENTION

Among intermetallic compounds between Nb (to be referred to as element A) and Ga, Al, or Ge (to be referred to as element B), A-15 compounds having the composition $A_3B$ show especially superior superconducting properties. There are other intermediate intermetallic compounds between elements A and B which are richer in element B than the composition $A_3B$. Examples are Nb-Ga intermetallic compounds such as $Nb_3Ga_2$ and $NbGa_3$ whose melting points are 1750° and 1250° C., respectively. These intermetallic compounds can be easily produced by heating at lower temperatures for shorter periods of time than can the A-15 type compounds. For example, the $Nb_3Ga_2$ compound can be produced by heating Nb and Ga at 850° C. for several tens of minutes to induce diffusion between Nb and Ga. On the other hand, $Nb_3Ga$, which is an A-15 type compound can be produced only at 1300° C. or higher.

According to the process of this invention, the surface of a substrate of element A is coated with at least one element B, and the coated substrate is heat-treated to form intermetallic compounds which are richer in element B than $A_3B$. Thereafter, the substrate is subjected to the irradiation of high-energy density beams such as electron beams or laser beams whereby it is rapidly heated and cooled. As a result, the intermetallic compounds react with the element A to give an A-15 type superconductor compound having the composition $A_3B$ which are composed of fine crystal grains. The superconductor compound therefore has a high Jc in a magnetic field.

The temperature at which the coated substrate is heated to form intermetallic compounds richer in element B than $A_3B$ is in the range of 500° to 2,000° C. If it is lower than 500° C., the intermetallic compound is not formed. If it exceeds 2,000° C., a solid solution having a body-centered cubic lattice which is richer in element A than $A_3B$ forms, and beam irradiation of this product does not lead to an A-15 type compound. The heat-treating temperature is preferably 700° to 1,300° C., more preferably 900° to 1,200° C. At temperatures above 1,300° C., the reaction product is a mixture of an A-15 type compound and an intermetallic compound richer in element B than $A_3B$. An A-15 compound obtained by beam irradiation of this mixture has somewhat reduced superconducting properties. The heat-treating time is shorter at higher temperatures, and longer at lower temperatures. It is generally 1 second to 300 hours. If it is less than 1 second, no intermetallic compound is formed. If it is longer than 300 hours, a solid solution richer in element A than $A_3B$ is formed. Beam irradiation of this product does not lead to an A-15 type compound. When the heat-treatment temperature is 700° to 1,300° C., the heat-treating time is 1 minute to 50 hours. When the temperature is 900° to 1,200° C., the heat-treating time is 3 minutes to 10 hours.

Coating of the niobium substrate with the element B can be carried out by various known methods, for example, by the immersion of the niobium substrate in a tank containing molten element B or by electroplating.

After the formation of the intermetallic compound as described above, the substrate is subjected to the irradiation of high energy density beams such as electron beams and laser beams. For example, high energy density beams are irradiated continuously on the niobium substrate in tape form in the longitudinal direction to react the intermetallic compound with niobium (element A) whereby an A-15 type superconductor compound having the composition $A_3B$ is formed.

The energy density of beam irradiation may be $10^3$ to $10^6$ W/cm$^2$. The preferred range of the energy density differs slightly between electron beam irradiation and laser beam irradiation. In the case of electron beam irradiation, the preferred range is $2 \times 10^3$ to $5 \times 10^4$ W/cm$^2$, and especially $5 \times 10^3$ to $10^4$ W/cm$^2$. In the laser beam irradiation, the preferred range is $10^4$ to $10^5$/cm$^2$, especially $2 \times 10^4$ to $5 \times 10^4$ W/cm$^2$. If the energy density is lower than $10^3$ W/cm$^2$, it is impossible to obtain high temperatures sufficient to induce the reaction between the intermetallic compound and niobium and to form the desired A-15 type superconductor compound. If, on the other hand, it exceeds $10^6$ W/cm$^2$, the substrate is overheated and melted off at the irradiated part.

The process of this invention offers the following excellent advantages.

(1) The process can be operated at lower temperatures than the prior art because it begins with the formation of intermetallic compounds between elements A and B.

(2) Elements B generally have low melting points (for example, Ga has a melting point of 29° C.), but the intermetallic compounds formed with element A have high melting points (for example, the melting point of $Nb_3Ga_2$ is 1750° C.). For this reason, the evaporation of element B during beam irradiation can be markedly inhibited, and the A-15 type compound can be formed efficiently.

(3) The reaction of the intermetallic compounds with the element A can give the superconductor compound within a very short period of time. Since the irradiation is carried out for a short period of time, heating is limited to the irradiated part. Thereafter, the heat is dissipated within the substrate of element A by heat conduction and the irradiated part is rapidly cooled. Consequently, an A-15 type compound having a fine crystal structure is formed which has excellent superconducting properties shown by a high Jc in a magnetic field.

The provision of a water-cooled copper hearth at the bottom surface of the substrate of element A can increase a rapid cooling effect.

(4) Since the product is rapidly cooled from a high temperature, the stoichiometric composition of the A-15 type compound, which is stable only at the high temperature, remains unchanged at room temperature. Hence, the resulting compound has excellent superconducting properties.

(5) Since irradiation can be carried out while moving the material or high density energy beams at a high speed, the production of the superconductor is efficient. A long strip of a tape of the superconductor compound can therefore be produced very easily, and the cost of production can be curtailed.

The following Examples illustrate the present invention more specifically.

EXAMPLE 1

A niobium tape was continuously passed through a molten bath of gallium heated at 800° C. at a feed rate of 30 cm/min. to coat gallium on it. The coated niobium tape was passed continuously through a furnace heated at 1,000° C. to form intermetallic compounds such as $Nb_3Ga_2$ and $NbGa_3$ richer in Ga than $Nb_3Ga$ on the surface of the tape. The tape was then placed on a water-cooled copper hearth, and electron beams were irradiated on the tape while the electron beams were rapidly moved longitudinally of the tape. The accelerating voltage of the electron beams was 20 KV. The beam current was 10 mA. The beam diameter on the tape surface was 2 mm. The energy density of the electron beams was 7 KW/cm$^2$. As a result, the intermetallic compounds reacted with niobium of the substrate to form an $Nb_3Ga$ superconductor compound.

The tape was heated only at the irradiated part, and melted. The heat dissipated to the non-irradiated part of the tape by heat conduction, whereupon the irradiated part of the tape was cooled rapidly.

The Jc values of the resulting $Nb_3Ga$ tape at 4.2 K. in a magnetic field of 10 T and 17 T are shown in Table 1 together with those of an $Nb_3Ga$ tape produced by a conventional diffusion method involving immersing an Nb tape in a Ga bath and thereafter heat-treating the product.

TABLE 1

| $Nb_3Ga$ tape | Jc (A/cm$^2$) 10 T, 4.2K | Jc (A/cm$^2$) 17 T, 4.2K |
|---|---|---|
| Example 1 | $2 \times 10^5$ | $6 \times 10^4$ |
| Diffusion method | $4 \times 10^3$ | $2 \times 10^3$ |

The tape obtained by this invention has much higher Jc values than that obtained by the conventional diffusion method as shown in Table 1 since the crystal grains of the resulting superconductor compound are fine.

EXAMPLE 2

A niobium tape was continuously passed through a molen bath of 70 atomic% Al-30 atomic% Ge heated at 900° C. to coat the Al-Ge molten alloy on the tape. The coated tape was then passed through a furnace heated at 1,000° C. to form intermetallic compounds such as $Nb(Al_{0.9}.Ge_{0.1})_3$ and $Nb(Al_{0.3}.Ge_{0.7})_2$ richer in aluminum or germanium than $Nb_3(Al_{0.7}.Ge_{0.3})$ on the surface of the tape. Electron beams were irradiated onto the surface of the coated tape while the electron beams were rapidly moved longitudinally of the tape. The accelerating voltage of the electron beams was 20 KV. The beam current was 10 mA. The beam diameter on the tape surface was 2 mm. The energy density of the electron beams was 7 KW/cm$^2$. As a result, the intermetallic compounds reacted with niobium of the substrate to form a superconductor compound $Nb_3(Al_{0.7}Ge_{0.3})$.

The resulting tape of $Nb_3(Al_{0.7}Ge_{0.3})$ superconductor compound had a Jc at 4.2 K. of $2 \times 10^5$ A/cm$^2$ at 10 T and $7 \times 10^4$ A/cm$^2$ at 17 T.

EXAMPLE 3

A niobium tape was continuously passed through a molten bath of aluminum heated at 900° C. The coated tape was passed through a furnace heated at 1,000° C. to form intermetallic compounds such as $NbAl_3$ and $NbAl_2$ richer in aluminum than $Nb_3Al$. Electron beams were irradiated onto the surface of the tape while the electron beams were rapidly moved longitudinally of the tape. As a result, the intermetalic compounds reacted with niobium of the substrate to form an A-15 type $Nb_3Al$ superconductor compound. The accelerating voltage of the electron beams was 20 KV. The beam current was 10 mA. The beam diameter on the tape surface was 2 mm. The energy density of the electron beans was 7 KW/cm$^2$.

The resulting tape had a Jc value at 4.2 K. of $1.55 \times 10^5$ A/cm$^2$ at 10 T, and $5 \times 10^4$ A/cm$^2$ at T.

What is claimed is:

1. A process for producing an A-15 type superconductor compound having the composition $A_3B$ composed of niobium (element A) and at least one element (B) selected from the group consisting of gallium, aluminum and germanium, which comprises
   a step of coating at least one element B on a substrate of niobium,
   a step of heat-treating the coated substrate at a temperature of 500° to 2,000° C. for 1 second to 300 hours to form intermetallic compounds of niobium and the element B on the substrate, and
   then subjecting the coated substrate having the intermetallic compounds formed thereon to irradiation of high energy density beams to form the A-15 type superconductor compound having the composition $A_3B$.

2. The process of claim 1 wherein the step of coating the element B is carried out by immersing the niobium substrate in a molten bath of the element B.

3. The process of claim 1 wherein heat-treating step is carried out at a temperature of 700° to 1,300° C. for a period of 1 minute to 50 hours.

4. The process of claim 1 wherein the the energy density of the beams is $10^3$ to $10^6$ W/cm$^2$.

5. The process of claim 1 wherein the A-15 type superconductor compound is in the form of a long strip.

* * * * *